United States Patent
Abe

(10) Patent No.: US 7,724,166 B2
(45) Date of Patent: May 25, 2010

(54) A/D CONVERTER

(75) Inventor: Naoyuki Abe, Kanagawa (JP)

(73) Assignee: Texas Instruments Incorporated, Dallas, TX (US)

( * ) Notice: Subject to any disclaimer, the term of this patent is extended or adjusted under 35 U.S.C. 154(b) by 43 days.

(21) Appl. No.: 12/253,071

(22) Filed: Oct. 16, 2008

(65) Prior Publication Data

US 2009/0102519 A1    Apr. 23, 2009

(30) Foreign Application Priority Data

Oct. 23, 2007   (JP)   ............... 2007-274727

(51) Int. Cl.
*H03M 1/00*   (2006.01)
(52) U.S. Cl. ............... 341/122; 348/308; 327/108
(58) Field of Classification Search ......... 341/122–155; 327/108; 348/308
See application file for complete search history.

(56) References Cited

U.S. PATENT DOCUMENTS

| | | | |
|---|---|---|---|
| 6,617,991 B2 * | 9/2003 | Kaul et al. | 341/155 |
| 6,882,294 B2 * | 4/2005 | Linder et al. | 341/154 |
| 6,943,720 B2 * | 9/2005 | Nakamori et al. | 341/156 |
| 7,208,983 B2 * | 4/2007 | Imaizumi et al. | 327/94 |
| 7,545,300 B2 * | 6/2009 | Boemler | 341/143 |
| 2001/0008268 A1 | 7/2001 | Funakoshi | |
| 2003/0011698 A1 | 1/2003 | Iesaka | |
| 2006/0109360 A1 | 5/2006 | Sakai et al. | |
| 2006/0237629 A1 | 10/2006 | Oda | |

FOREIGN PATENT DOCUMENTS

WO    2008052569 A2    5/2008

* cited by examiner

*Primary Examiner*—Lam T Mai
(74) *Attorney, Agent, or Firm*—John J. Patti; Wade J. Brady, III; Frederick J. Telecky, Jr.

(57) ABSTRACT

An apparatus is provided. The apparatus comprises a sample and hold circuit, a converter, and an adjustable current circuit. The sample and hold circuit is adapted to receive an analog input signal and to output an amplified signal. The converter is coupled to the sample and hold circuit and that converts the amplified signal to a digital signal. The controller is coupled to the converter and that receives the digital signal. The controller includes a plurality of voltage ranges, wherein each voltage range is associated with a current value, and the controller compares the digital signal to at least one of the voltage ranges to output at least one of the current values. The adjustable current circuit is coupled to the sample and hold amplifier and to the controller so that the adjustable current circuit provides a generally constant operating current that corresponds to the current value output from the controller.

18 Claims, 2 Drawing Sheets

A/D CONVERTER

CROSS-REFERENCE TO RELATED APPLICATIONS

This application claims priority to Japanese Application No. 2007-274,727, entitled "A/D Converter," filed on Oct. 23, 2007, which is hereby incorporated by reference for all purposes.

TECHNICAL FIELD

The invention relates generally to an analog to digital converter (ADC) and, more particularly, to controlling the current for a sample and hold amplifier.

BACKGROUND

Cameras that take moving pictures and still pictures have an ADC that converts the image data detected with an image sensor to digital data. This digital data is then processed by an image processor or stored in a nonvolatile storage medium.

Because the analog signal output from the image sensor is a typically weak signal, the held sample is first amplified by an amplifier and then output to a converter in a latter stage for conversion to a digital signal. The amplifier is usually set for operation with a high operating current so that even when an analog signal of maximum amplitude is input, it is still possible to output a distortion-free waveform. However, when a small amplitude analog signal is input continuously, although a low operating current is enough for the small amplitude analog signal, a large operating current is employed. The use of these large operating currents can reduce battery life and cause other deleterious problems.

Some examples of prior art camera systems are PCT Publication No. WO2008052569, and U.S. Patent Pre-Grant Pub. Nos. 2001/008268; 2003/011698; 2006/109360; and 2006/237629.

SUMMARY

A preferred embodiment of the present invention, accordingly, provides that image sensor outputs include captured image data as a serial analog signal, and while the image data for the consecutive image capture positions are continuously output, the image data for positions very close to the capture position form a continuum, so that there are not drastic changes in the magnitude of the analog signal (amplitude of the image data).

The present invention also can provide an ADC characterized by the following facts: the ADC has a sample and hold circuit that performs sample holding for the input analog signal and outputs it, and a converter that converts the signal fed from said sample and hold circuit to digital form for output; said sample and hold circuit has a capacitor circuit that performs sampling of said input analog signal, an amplifier that amplifies the voltage held in said capacitor circuit and outputs it to said converter, an adjustable current circuit that feeds the operating current to said amplifier, and a controller that controls said adjustable current circuit and controls the operating current of said amplifier corresponding to the value of the digital signal output from said converter.

Also, the present invention pertains to the ADC that includes an attenuator that attenuates the amplitude of said input analog signal to be fed to said capacitor circuit corresponding to the value of said digital signal.

In addition, the present invention pertains to the ADC wherein the input analog signal is continuous image data output from an image sensor.

Furthermore, the present invention provides a camera characterized by the following facts: the picture taking device has an image sensor and an ADC; the image sensor has multiple pixels and the outputs image captured by said pixels as a pixel by pixel serial analog signal; and said analog signal output from said image sensor is input as said input analog signal to said ADC.

In accordance with another embodiment of the present invention, an apparatus is provided. The apparatus comprises a sample and hold circuit that is adapted to receive an analog input signal and to output an amplified signal; a converter that is coupled to the sample and hold circuit and that converts the amplified signal to a digital signal; a controller that is coupled to the converter and that receives the digital signal, wherein the controller includes a plurality of voltage ranges, wherein each voltage range is associated with a current value and wherein the controller compares the digital signal to at least one of the voltage ranges to output at least one of the current values; and an adjustable current circuit that is coupled to the sample and hold amplifier and to the controller, wherein the adjustable current circuit provides a generally constant operating current that corresponds to the current value output from the controller.

In accordance with another embodiment of the present invention the sample and hold circuit further comprise a capacitor circuit that is adapted to sample and hold at least a portion of the analog signal in synchronization with a clock signal; and an amplifier that is coupled to the capacitor circuit, wherein the amplifier is adapted to output the amplified signal.

In accordance with another embodiment of the present invention, the adjustable current circuit is interposed between ground and a negative power input for the amplifier.

In accordance with another embodiment of the present invention, the adjustable current circuit is interposed between a power supply rail and a positive power input for the amplifier.

In accordance with another embodiment of the present invention, the apparatus further comprises an attenuator that is adapted to attenuate the analog input signal prior to being input into the sample and hold amplifier.

In accordance with another embodiment of the present invention, the controller outputs a control signal to the attenuator that corresponds to the digital signal.

In accordance with another embodiment of the present invention, the apparatus further comprises an image sensor that outputs the analog signal.

In accordance with another embodiment of the present invention, an apparatus is provided. The apparatus comprises an image sensor that outputs an analog signal; a capacitor circuit that is adapted to sample and hold at least a portion of the analog signal in synchronization with a clock signal; an amplifier that is coupled to the capacitor circuit, wherein the amplifier is adapted to output the amplified signal; a converter that is coupled to the amplifier and that converts the amplified signal to a digital signal; a controller that is coupled to the converter and that receives the digital signal, wherein the controller includes a plurality of voltage ranges, wherein each voltage range is associated with a current value, and wherein the controller compares the digital signal to at least one of the voltage ranges to output at least one of the current values; and an adjustable current circuit that is coupled to the sample and hold amplifier and to the controller, wherein the adjustable current circuit provides a generally constant operating current that corresponds to the current value output from the controller.

In accordance with another embodiment of the present invention, a method is provided, The method comprises the steps of sampling and holding at least a portion of an analog signal to generate a sampled and held signal; amplifying the sampled and held signal by an amplifier to generate an amplified signal; converting the amplified signal to a digital signal; comparing the digital signal to at least one voltage range of a plurality of voltage ranges to generate an output value, wherein each voltage range corresponds to a current value; and adjusting the operating current for the amplifier to be a generally constant current corresponding to the output value.

In accordance with another embodiment of the present invention, the method further comprises: receiving an image from optical elements by an image sensor; and converting at least a portion of the image to the analog signal.

In accordance with another embodiment of the present invention, the step of adjusting further comprises the step of adjusting current flowing from the amplifier to ground.

In accordance with another embodiment of the present invention, the step of adjusting further comprises the step of adjusting current flowing from a power supply rail to the amplifier.

In accordance with another embodiment of the present invention, the method further comprises the step of attenuating the analog signal by an attenuator prior to the step of sampling and holding.

In accordance with another embodiment of the present invention, the step of attenuating further comprises the step of adjusting the attenuator in accordance with the digital signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
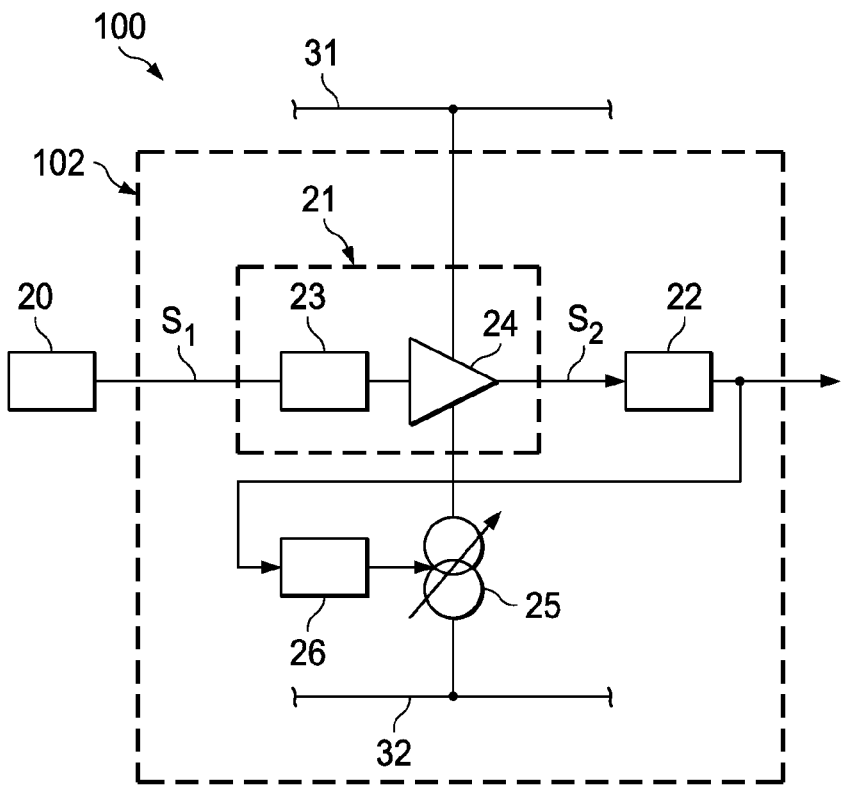
FIG. 1 is a block diagram of an ADC in accordance with an embodiment of the present invention.

Refer now to the drawings wherein depicted elements are, for the sake of clarity, not necessarily shown to scale and wherein like or similar elements are designated by the same reference numeral through the several views.

Figure 2:
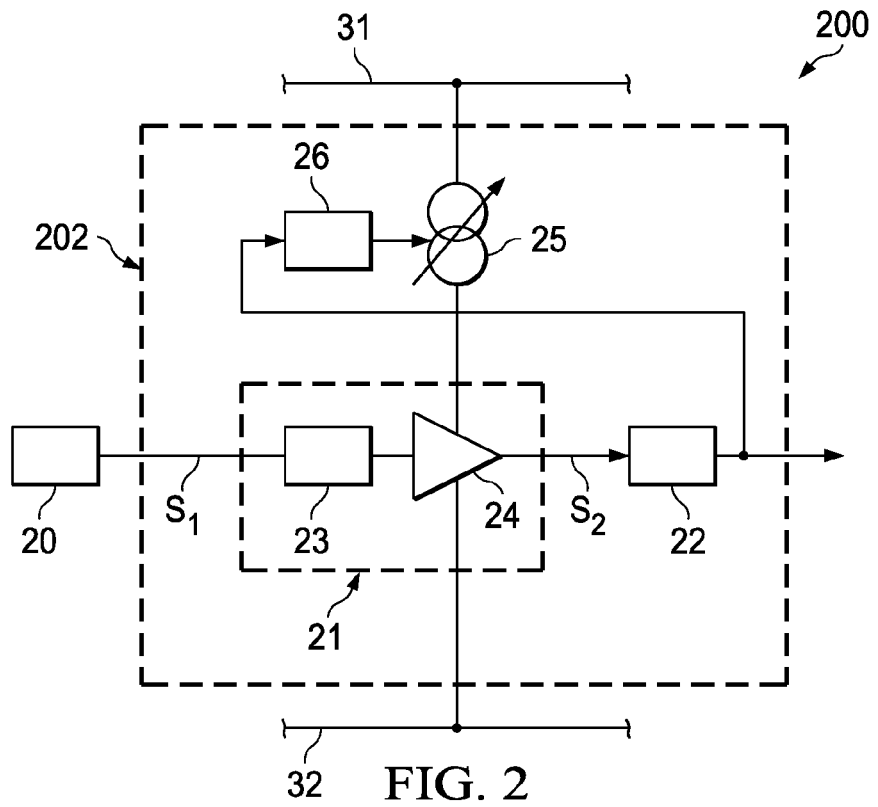
FIG. 2 is a block diagram of an ADC in accordance with an embodiment of the present invention.

In FIGS. 1 and 2, reference numerals 100 generally designate an internal circuit for a camera in accordance with an embodiment of the present invention. Internal circuits 100 and 200 generally comprise an image sensor 20 and an ADC 102 and 202 (respectively).

Turning first to the image sensor, an optical system is employed to direct light or project an image onto the image sensor 20. The image sensor 20 has multiple pixels, and a minute portion of the image is projected onto each pixel. The image data of the various pixels is temporarily stored. The storage contents of the various pixels are output in synchronization with a clock signal as an analog signal sent in series to ADCs 102 and 202.

Now turning to the ADCs 102 and 202, each ADC 102 and 202 also includes several subcomponents. Preferably, each ADC 102 and 202 includes a sample and hold circuit 21, a converter 22, a current controller 26, and an adjustable current circuit or adjustable current source 25, and the sample and hold circuit 21 further include capacitor circuit 23 and an amplifier 24.

In operation, the analog signal output from image sensor 20 is sampled and held in synchronization with the clock signal by capacitor circuit 23 and is output to amplifier 24. To power the amplifier, a power supply rail 31 and adjustable current source 25 are employed. In each case, amplifier 24 is coupled to power supply rail 31 at its positive power input and ground 32 at its negative power input. Adjustable current circuit 25 can then be interposed between ground 32 and amplifier 24 (circuit 100) or between power supply rail 31 and amplifier 24 (circuit 200). In either case, the adjustable current circuit 25 functions to provide amplifier 24 with a generally constant operating current. The output signal of amplifier 24 is input to converter 22, which converts the sampled and amplified analog signal to a digital signal that can be output to a later processing stage.

Depending on the amplification operation of amplifier 24, the holding capacitor(s) within the capacitor circuit 23 may not discharge. Under these circumstances, when a large signal is output from amplifier 24, the current flowing out of or into amplifier 24 becomes higher, so that a higher operating current is needed. If the operating current is insufficient, the output of amplifier 24 becomes saturated, and a desired ADC conversion cannot be obtained. Conversely, when the operating current is set at a higher level, power is wasted inside amplifier 24 when a small signal is output.

According to the present invention, a current controller 26 for adjusting the constant current value flowing in adjustable current circuit 25 is provided in ADCs 102 and 202. The digital signal from converter 22 is output to current controller 26, and this digital signal input corresponds to a step-wise reference current value that is adjusted according to the magnitude of the voltage indicated by the digital signal. In other words, current controller 26, a plurality of step-wise or incremental reference current values are set corresponding to the digital signal values. These reference current value(s) corresponding to the input digital signal can then be output to adjustable current circuit 25. The adjustable current circuit 25 sets a generally constant current value corresponding to the input from current controller 26. Consequently, when the digital signal has a lower voltage, the operating current of amplifier 24 can be decreased, and when the digital signal has a higher voltage, the operating current of amplifier 24 can be increased.

Figure 3:
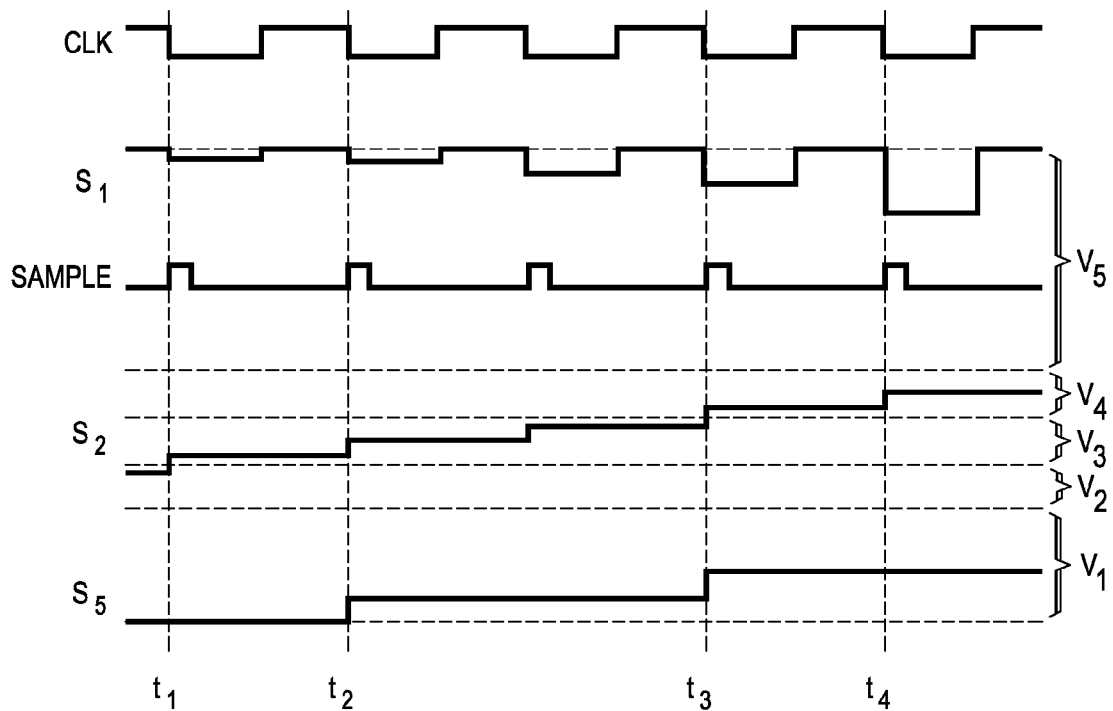
FIG. 3 is a timing diagram of the relationship between change in the analog signal and the output of the adjustable current circuit.

FIG. 3 is a timing depicting the relationship between change in the analog signal and the output of adjustable current circuit 25. Analog signal $S_1$ is input in synchronization with clock signal CLK to capacitor circuit 23, and capacitor circuit 23 samples and holds analog signal $S_1$ in response to sampling signal SAMPLE. The held signal is input to amplifier 24, and amplified output signal $S_2$ is output to converter 22. A digital signal is output from converter 22 in synchronization with the clock signal.

Within controller 26, there are a number of voltage ranges $V_1$ through $V_5$. Current controller 26 classifies the digital signal (input to current controller 26) one of the voltage ranges $V_1$ through $V_5$ according to its value, and there is a generally constant current value associated with each of ranges $V_1$ through $V_5$. Current controller 26 can then output a generally constant current value to adjustable current circuit 25 according to the value of the digital signal input to the controller 26. Adjustable current circuit 25 adjusts the current $S_5$ accordingly.

Figure 4:
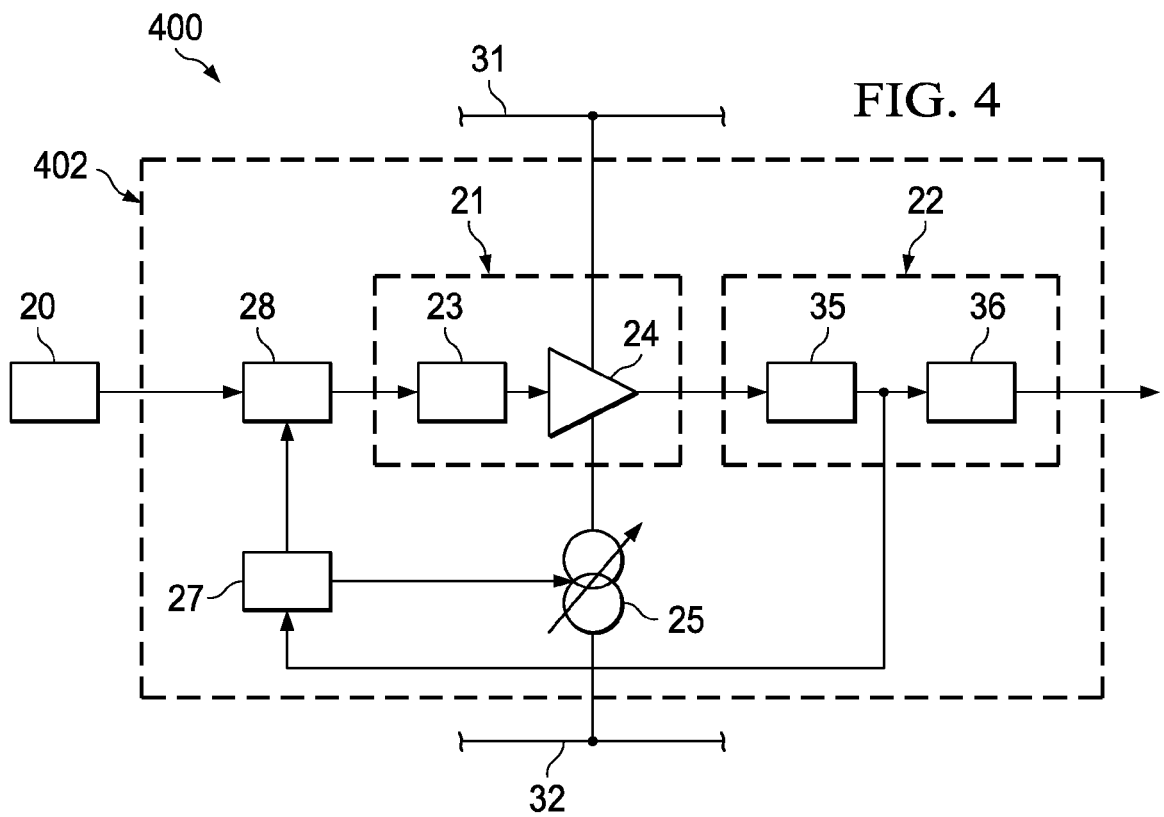
FIG. 4 is a block diagram of an ADC in accordance with an embodiment of the present invention.

Additionally, in internal circuit 400 shown in FIG. 4 another embodiment of the present invention is shown. ADC 420 of circuit 400 has current controller 27 that adjusts the operating current of amplifier 24 and an attenuator 28 interposed between image sensor 20 and sample and hold circuit 21. Current controller 27, in addition to setting the current value for adjustable current circuit 25, sets the attenuation rate of attenuator 28 corresponding to the value of the input digital signal.

Attenuator 28 attenuates the analog signal output from image sensor 20 at the preset attenuation rate, and the attenuated analog signal is output to sample and hold circuit 21. The attenuation rate of attenuator 28 is set higher when the voltage of the digital signal input to current controller 27 is higher, and it is set lower when the voltage of the digital signal is lower. Consequently, the output of amplifier 24 is not saturated with respect to the analog signal over a wide voltage range. For example, the attenuation rate set for attenuator 28 and the amplification rate set for amplifier 24 may be set, as desired, at 1 or lower than 1 or higher than 1.

For ADC 402, controller 27 controls both attenuator 28 and adjustable current circuit 25 based on the digital signal fed from converter 22. However, one may also adopt a scheme in which the digital signal from converter 22 is also fed to attenuator 28, and attenuator 28 independently controls the attenuation rate based on the digital signal. A scheme can also be adopted in which the operating current of amplifier 24 is controlled based on the voltage value of the analog signal, such as the output signal of amplifier 24.

Moreover, ADC 402 is a so-called pipeline type ADC, in which the output signal of amplifier 24 is, for example, converted to the digital signal in two steps. First, the intermediate value digital value is determined at a low resolution by initial-stage circuit 35 in converter 22. Then, the precision of the intermediate value is improved in latter-stage circuit 36, and the final digital signal is output. The digital value output from said initial-stage circuit 35 is fed to current controller 27 and attenuator 28, and operation is performed according to the digital value. Because the resolution of the input digital value is coarse, the number of generally constant current values that can be set in adjustable current circuit 25 are smaller. However, it is possible to perform finer control for the current set in adjustable current circuit 25 by making resolution of the value of the input digital signal finer.

According to the present invention, the operating current of the amplifier is controlled based on the amplitude of the image data of the preceding pixel. Usually, however, the amplitude of the image data of a nearby pixel rarely drastically changes in the image signal. Consequently, distortion in the image data output from the amplifier caused by control of the operating current of the amplifier in the present invention rarely occurs.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
 a sample and hold circuit that is adapted to receive an analog input signal and to output an amplified signal;
 a converter that is coupled to the sample and hold circuit and that converts the amplified signal to a digital signal;
 a controller that is coupled to the converter and that receives the digital signal, wherein the controller:
  includes a plurality of voltage ranges, wherein each voltage range is associated with a current value; and
  compares the digital signal to at least one of the voltage ranges to output at least one of the current values; and
 an adjustable current circuit that is coupled to the sample and hold circuit and to the controller, wherein the adjustable current circuit provides a generally constant operating current that corresponds to the current value output from the controller.

2. The apparatus of claim 1, wherein the sample and hold circuit further comprises:
 a capacitor circuit that is adapted to sample and hold at least a portion of the analog signal in synchronization with a clock signal; and
 an amplifier that is coupled to the capacitor circuit, wherein the amplifier is adapted to output the amplified signal.

3. The apparatus of claim 2, wherein the adjustable current circuit is interposed between ground and a negative power input for the amplifier.

4. The apparatus of claim 2, wherein the adjustable current circuit is interposed between a power supply rail and a positive power input for the amplifier.

5. The apparatus of claim 1, wherein the apparatus further comprises an attenuator that is adapted to attenuate the analog input signal prior to being input into the sample and hold circuit.

6. The apparatus of claim 5, wherein the controller outputs a control signal to the attenuator that corresponds to the digital signal.

7. The apparatus of claim 1, wherein the apparatus further comprises an image sensor that outputs the analog signal.

8. An apparatus comprising:
 an image sensor that outputs an analog signal;
 a capacitor circuit that is adapted to sample and hold at least a portion of the analog signal in synchronization with a clock signal;
 an amplifier that is coupled to the capacitor circuit, wherein the amplifier is adapted to output an amplified signal;
 a converter that is coupled to the amplifier and that converts the amplified signal to a digital signal;
 a controller that is coupled to the converter and that receives the digital signal, wherein the controller:
  includes a plurality of voltage ranges, wherein each voltage range is associated with a current value; and
  compares the digital signal to at least one of the voltage ranges to output at least one of the current values; and an adjustable current circuit that is coupled to the amplifier and to the controller, wherein the adjustable current circuit provides a generally constant operating current that corresponds to the current value output from the controller.

9. The apparatus of claim 8, wherein the adjustable current circuit is interposed between ground and a negative power input for the amplifier.

10. The apparatus of claim 8, wherein the adjustable current circuit is interposed between a power supply rail and a positive power input for the amplifier.

11. The apparatus of claim 8, wherein the apparatus further comprises an attenuator that is adapted to attenuate the analog input signal prior to being input into the amplifier.

12. The apparatus of claim 11, wherein the controller outputs a control signal to the attenuator that corresponds to the digital signal.

13. A method comprising:
sampling and holding at least a portion of an analog signal to generate a sampled and held signal;
amplifying the sampled and held signal by an amplifier to generate an amplified signal;
converting the amplified signal to a digital signal;
comparing the digital signal to at least one voltage range of a plurality of voltage ranges to generate an output value, wherein each voltage range corresponds to a current value; and
adjusting the operating current for the amplifier to be a generally constant current corresponding to the output value.

14. The method of claim 13, wherein the method further comprises:
receiving an image from optical elements by an image sensor; and
converting at least a portion of the image to the analog signal.

15. The method of claim 13, wherein the step of adjusting further comprises the step of adjusting current flowing from the amplifier to ground.

16. The method of claim 13, wherein the step of adjusting further comprises the step of adjusting current flowing from a power supply rail to the amplifier.

17. The method of claim 13, wherein the method further comprises the step of attenuating the analog signal by an attenuator prior to the step of sampling and holding.

18. The method of claim 13, wherein the step of attenuating further comprises the step of adjusting the attenuator in accordance with the digital signal.

* * * * *